United States Patent

Nienhuis

[15] 3,649,885

[45] Mar. 14, 1972

[54] TETRODE MOSFET WITH GATE SAFETY DIODE WITHIN ISLAND ZONE

[72] Inventor: Rijkent Jan Nienhuis, Emmasingel, Eindhoven, Netherlands

[73] Assignee: U.S. Philips Corporation, New York, N.Y.

[22] Filed: June 24, 1970

[21] Appl. No.: 49,404

[30] Foreign Application Priority Data

July 3, 1969 Netherlands..........................6910195

[52] U.S. Cl........................317/235, 317/235 G, 317/235 B, 317/235 E, 317/235 T

[51] Int. Cl........................................................H01l 11/14

[58] Field of Search............317/235 G, 235 B, 235 E, 235 T, 317/235 R

[56] References Cited

UNITED STATES PATENTS

| | | | |
|---|---|---|---|
| 3,512,058 | 5/1970 | Khorjezadeh | 317/235 |
| 3,469,155 | 9/1969 | Van Beek | 317/235 |
| 3,555,374 | 6/1970 | Usuda | 317/235 |
| 3,470,390 | 9/1969 | Lin | 317/235 |

FOREIGN PATENTS OR APPLICATIONS

| | | | |
|---|---|---|---|
| 801,891 | 12/1968 | Canada | 317/235 |
| 1,131,675 | 10/1968 | Great Britain | 317/235 |

*Primary Examiner*—John W. Huckert
*Assistant Examiner*—Martin H. Edlow
*Attorney*—Frank R. Trifari

[57] ABSTRACT

A field-effect transistor having at least two insulated-gate electrodes comprises an island zone of the same conductivity type as the electrode zones (source and drain zones) situated between two gate electrodes. According to the invention an aperture is provided in said island zone in which aperture a circuit element is provided, particularly a safety diode, which is connected to a gate electrode. In this case a particularly simple and short connection is possible between the circuit element and a gate electrode.

9 Claims, 3 Drawing Figures

INVENTOR.
RIJKENT J.NIENHUIS

BY

Frank R. Trifari

AGENT

INVENTOR.
RIJKENT J. NIENHUIS
BY
Frank R. Trifari
AGENT

TETRODE MOSFET WITH GATE SAFETY DIODE WITHIN ISLAND ZONE

The invention relates to a field-effect transistor having a semiconductor substrate of the one conductivity type comprising two juxtaposed zones or regions of the opposite conductivity type adjoining a surface of the substrate and constituting the electrode zones of the transistor, an insulating layer being provided on the said surface on which layer at least two gate electrodes situated between the electrode zones are provided, a diffused zone, termed island zone, of the opposite conductivity type and adjoining the said surface being provided between said gate electrodes in the semiconductor substrate.

It is often desirable to connect a safety diode to a gate electrode. Such a safety diode protects the insulating layer situated below the gate electrode from breakdown when the voltage difference across the insulating layer tends to become too large.

It often difficult to satisfactorily connect a gate electrode to a safety diode which is also provided in the semiconductor substrate. Such a connection may consist of a conductive track provided on the insulating layer. This track cannot cross the further gate electrode in an insulated manner or can cross it only by means of an expensive, complicated structure. Furthermore it is often undesirable that such a conductive track should be present partly above an electrode zone since this can introduce an undesirable capacity.

Moreover, a very short connection of low resistance is usually desirable between a gate electrode and a safety diode connected thereto so as to prevent, in the case of large currents through the diode, destruction of said connection by heating and to avoid too large an inertia of the diode. Actually, the resistance of the connection may cause the insulating layer below the gate electrode to break down sooner than the safety diode even if the breakdown voltage of the safety diode is lower than that of the insulating layer.

It will be obvious that when using another semiconductor element which is to be connected to a gate electrode, problems present themselves similar to those described above with respect to a safety diode.

It is the object of the invention to provide a simple structure for a field effect transistor having at least two gate electrodes and a semiconductor circuit element connected to a gate electrode, in particular a safety diode, in which a very short connection with the gate electrode is possible which neither crosses a further gate electrode nor is situated partly above an electrode zone of the field-effect transistor.

According to the invention, a field-effect transistor of the type mentioned in the preamble is characterized in that the island zone comprises an aperture in which the substrate of the one conductivity type extends up to the said surface and in which aperture a semiconductor circuit element is present which is connected to a gate electrode. The circuit element is provided within the field-effect transistor in such manner that the operation of the field-effect transistor is substantially not influenced.

The invention is of particular importance for a field-effect transistor in which one of the two electrode zones is surrounded by one of the two gate electrodes, said one gage electrode is surrounded by the other of the two gate electrodes, and said other gate electrode is surrounded by the other of the two electrodes zones, in particular in such a structure it was difficult to connect a semiconductor circuit element to a gate electrode, particularly to the one (innermost) gate electrode, to which difficulty the invention provides an efficacious and simple solution.

A very important embodiment of a field-effect transistor according to the invention is characterized in that a safety diode which is connected to a gate electrode is provided in the aperture of the island zone. The safety diode is preferably connected to the one gate electrode since it is desirable that the distance between a safety diode connected to said one gate electrode and the electrode zone situated near the other gate electrode which is usually associated with the electric input of the transistor, should be as short as possible as will be described in detail below. Usually, a safety diode which is situated at a short distance from the electrode zone situated near said other gate electrode can be connected without objection to the other gate electrode by providing said safety diode in an aperture of said electrode zone or beyond said electrode zone.

The safety diode preferably comprises a first surface zone of the opposite conductivity type and a second surface zone of the one conductivity type adjoining said first surface zone but having a higher doping than the substrate. The PN-junction of the diode between said surface zones then has a low breakdown voltage so that good protection is obtained while the current through the diode can be supplied or dissipated via the substrate.

The second surface zone can fully encircle the first surface zone. Surface channels which would connect the island zone to the first surface zone of the diode are avoided as a result.

The first diode zone can be connected to a gate electrode, the diode having only one PN-junction.

A safety diode having two PN-junctions is often desirable in which the gate electrode connected to the diode can be operated with negative and positive voltages relative to the substrate and safety is obtained against positive and negative pulses at the gage electrode relative to the substrate. A further preferred embodiment according to the invention is therefore characterized in that the safety diode comprises a third surface zone of the one conductivity type which is surrounded entirely in the semiconductor substrate by the first surface zone, the third surface zone being connected to a gate electrode.

It is usually desirable to supply or dissipate the current through the safety diode situated in the aperture of the island zone via the electrode zone situated near the gate electrode which is not connected to said safety diode, said electrode being associated with the electric input of the field-effect transistor. In this case the current must flow through a part of the substrate which is high-ohmic, whereas the resistance for said current preferably is low. An important preferred embodiment of a field-effect transistor according to the invention is therefore characterized in that the second surface zone of the safety diode is connected to an electrode zone by a connection zone, which connection zone is a surface zone of the one conductivity type which is more highly doped than the island zone, adjoins the second surface zone, crosses a part of the island zone adjoining the apertures, crosses the gate electrode which is not connected to the diode and adjoins the electrode zone while forming a PN junction which is short-circuited by a metal layer present on the semiconductor substrate. It is found that the operation of the field-effect transistor is substantially not influenced by the connection zone when the dimensions of said zone are kept small. The breakdown voltage between the island zone and the substrate is decreased by the connection zone which is of the same conductivity type as the substrate but this is not disturbing for many applications. The breakdown characteristic of the safety diode is found to be improved by the connection zone.

An embodiment which comprises a very short connection having a small resistance between a gate electrode and the circuit element connected thereto is characterized according to the invention in that the gate electrode which is connected to the semiconductor circuit element in the aperture of the island zone comprises a widening or pad to which a connection conductor can be connected and which is situated for the greater part on the insulating layer and above the aperture and which is connected to the circuit element via an aperture in the insulating layer. The widening thus also serves to provide the gate electrode with a connection conductor.

In order that the invention may be readily carried into effect, it will now be described in greater detail, by way of example, with reference to an embodiment and the diagrammatic drawing.

FIG. 1 is a plan view of a field-effect transistor according to the invention, of which

Figure 1:
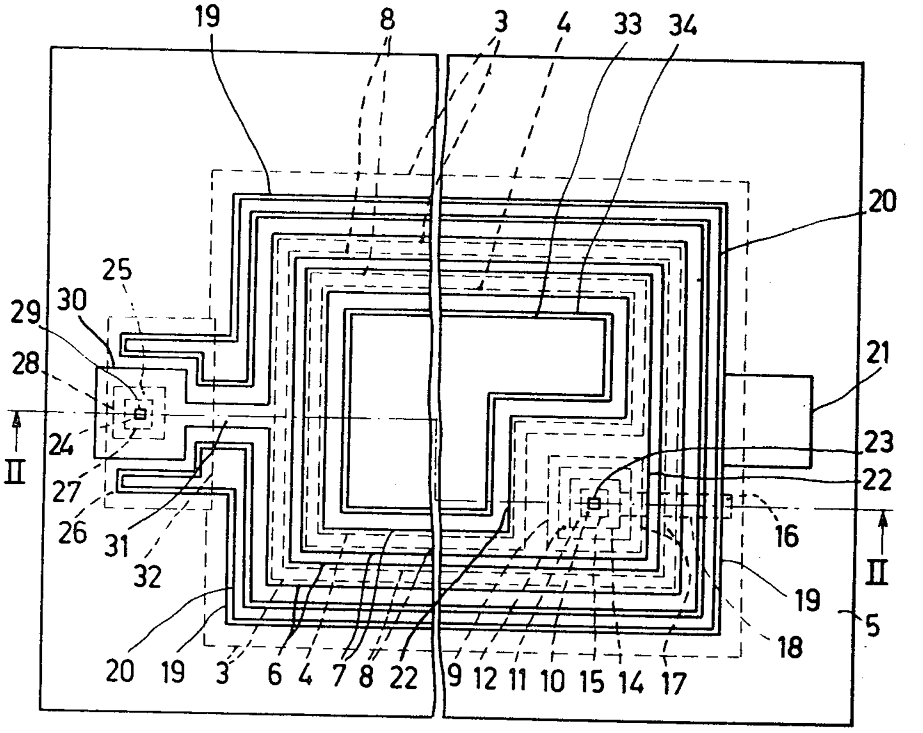
Figure 2:
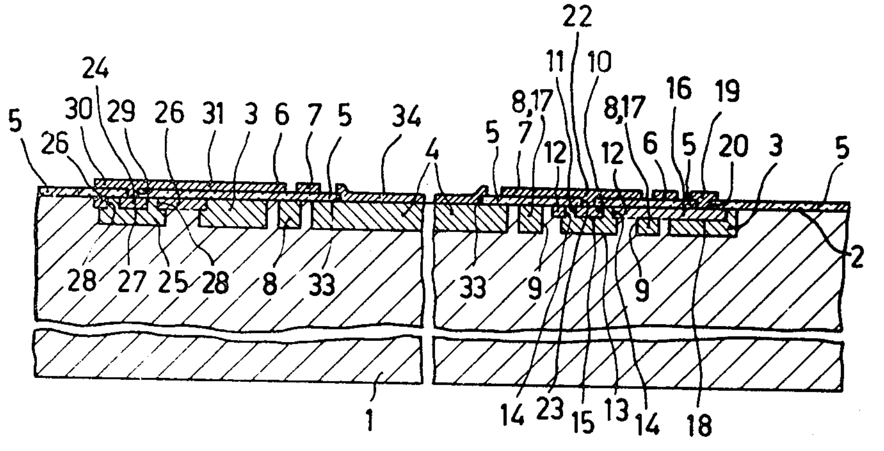
FIG. 2 is a cross-sectional view taken on the line II—II of FIG. 1.

The field-effect transistor shown in FIGS. 1 and 2 comprises a semiconductor substrate of the one conductivity type provided with two juxtaposed zones or regions 3 and 4 of the opposite conductivity type which adjoin a surface 2 of the substrate and are the electrode zones (source and drain zones) of the transistor. An insulating layer 5 is provided on the surface 2 on which layer two gate electrodes 6 and 7 situated between the electrode zones 3 and 4 are provided. A diffused zone 8, termed island zone, of the opposite conductivity type is provided in the semiconductor substrate between said gate electrodes. The island zone 8 adjoins the surface 2 but is normally unconnected and at floating potential.

According to the invention, the island zone 8 comprises an aperture 9 in which the substrate 1 reaches or extends up to the surface 2 and in which aperture a semiconductor circuit element is provided which comprises the zones 10, 11 and 12 and which is connected to the gate electrode 7.

In the present example the one electrode zone 4 is surrounded by the one gate electrode 7, said one gate electrode 7 is surrounded by the other gate electrode 6 and said other gate electrode 6 is surrounded by the other electrode zone 3.

The semiconductor circuit element 10, 11, 12 connected to the one gate electrode 7 is a safety diode. The safety diode can comprise only the zone 11 which forms a PN-junction 13 with the substrate 1. Since the substrate 1 must be high-ohmic to obtain a good operation of the field-effect transistor, the breakdown voltage of the PN-junction often is too high to obtain a sufficiently certain safety. Therefore, the safety diode in the present example comprises a first surface zone 11 of the opposite conductivity type and a second surface zone 12 of the one conductivity type adjoining said zone 11 and having a higher doping than the substrate 10. Since the zone 12 is more highly doped than the substrate 1, the breakdown voltage of the PN-junction 14 between the zones 11 and 12 is lower than that of the PN-junction 13.

The second surface zone 12 fully encircles the first surface zone 11 so that the formation of surface channels which connect the zone 11 the island zone 8 is prevented.

The zone 11 can be connected to the gate electrode 7 in which the safety diode has only one PN-junction 14. However, it is often desirable to be able to operate the gate electrode 7 with negative and positive voltages relative to the substrate 1, in which safety against breakdown of the insulating layer is desirable for positive and negative pulses at the gate electrode 7 relative to the substrate 1. Therefore, in the present example the safety diode comprises a third surface zone 10 of the one conductivity type which is fully surrounded in the semiconductor substrate by the first surface zone 11, said third surface zone 10 being connected to the gate electrode 7. As a result of this the diode comprises a second PN-junction 15 while the diode shows a PNP or NPN-structure.

When a field-effect transistor of the type to which the present example relates is used, the outermost electrode zone 3 usually is the source zone and is associated with the electric input of the transistor, while the innermost electrode zone 4 is the drain zone and is associated with the electric output of the transistor. The current through the safety diode which occurs, for example, in the case of breakdown of the diode, preferably is supplied or removed via the electrode zone 3. Furthermore it is desirable that the resistance in the field-effect transistor for said current should be low. In order to avoid that said current must flow through a part of the high-ohmic substrate 1, the second surface zone 12 of the safety diode is connected to the electrode zone 3 by a connection zone 16. This connection zone 16 is a surface zone of the one conductivity type which is more highly doped than the island zone 8, adjoins the second surface zone 12, crosses a part 17 of the island zone 8 adjoining the aperture 9, crosses the gate electrode 6 which is not connected to the diode and adjoins the electrode zone 3 while forming a PN-junction 18. The PN-junction 18 is short-circuited by the metal layer 19 present on the semiconductor substrate. The metal layer 19 is present in the aperture 20 of the insulating layer 5 and moreover is the connection contact for the electrode zone 3. The metal layer 19 comprises a widening or pad 21 which is situated on the insulating layer 5 and to which a connection conductor can be connected. The electrode zone 3, the metal layer 19 and the connection zone 16 form a path of low resistance for the currents to be supplied to or removed from the diode. In addition said path is short. If, for example, the diode were provided in an aperture in the electrode zone 4, said path would be longer.

Since the connection zone 16 is small as compared with the channel zones situated between the island zone 8 and the electrode zone 3, the operation of the transistor is hardly influenced or is not influenced at all by said connection zone.

It is to be noted that current in the island zone 8 can flow around the aperture 9 as a result of which said aperture 9 influences the operation of the transistor only very slightly.

The breakdown voltage between the island zone 8 and the substrate 1 is reduced by the connection zone 16 which is of the same conductivity type as the substrate 1 and is more highly doped than the substrate 1. This is not disturbing since during operation the potential difference between the island zone 8 and the substrate 1 is not large. Were the safety diode 10, 11, 12 provided in an aperture of the electrode 4 and connected to the electrode zone 3 by the connection zone 16, the breakdown voltage between the electrode zone 4 and the substrate 1 would be reduced and this would be disadvantageous indeed.

Since the safety diode is situated in the aperture 9 of the island zone 8 and the gate electrode 7 connected to the safety diode is situated between the island zone 8 and the electrode zone 4, so very close to the island zone 8, a very short connection between the gate electrode 7 and the safety diode is possible which need not cross the gate electrode 6 and need not be situated partly above an electrode zone either.

The gate electrode 7 which is connected to the safety diode 10, 11, 12 in the aperture 9 of the island zone 8 comprises a widening or pad 22 to which a connection conductor can be connected and which is situated for the greater part on the insulating layer 5 and above the aperture 9 of the island zone 8 and which is connected to the zone 10 of the diode 10, 11, 12 via an aperture 23 in the insulating layer 5. The widening 22 simultaneously forms a short connection of low resistance between the diode and the gate electrode 7 and a metal layer connected to the gate electrode 7 to which layer a connection conductor can be connected.

In the present example the gate electrode 6 is connected similarly as the gate electrode 7 to a safety diode. This safety diode 24, 25, 26 comprises, as well as the diode 10, 11, 12, a first zone 25 of the opposite conductivity type, a second zone 26 of the one conductivity type which is situated beside the first zone 25 and fully surrounds said zone, and a third zone 24 of the one conductivity type which is situated in the first zone 25. The diode 24, 25, 26 hence also comprises PN-junctions 27 and 28. The third zone 24 is connected via the aperture 29 in the insulating layer 5, to the metal layer 30 which is present on the insulating layer 5 and said metal layer 30 is connected to the gate electrode 6 by the conductive track 31 present on the insulating layer 5.

The second zone 26 adjoins the electrode zone 3 while forming the PN-junction 32 which, as shown in FIG. 1, is short-circuited at two places by the metal layer 19 in the aperture 20 of the insulating layer 5.

So both safety diodes are connected between a gate electrode and the electrode zone 3.

The metal layer 30 furthermore serves as a pad to connect a connection conductor to the gate electrode 6.

A metal layer 34 is connected to the electrode zone 4 via the aperture 33 in the insulating layer 5.

The field-effect transistor described can be manufactured entirely in the conventional manner and from conventional materials.

The substrate 1, for example, consists of a monocrystalline P-type silicon body having a resistivity of approximately 10 ohm. cm. The zones 3, 4, 8, 11 and 25 can be obtained simultaneously by diffusion of phosphorus and be N-type conductive, have a thickness of approximately 2.5$\mu$ and a surface concentration of approximately $10^{18}$ phosphorus atoms per cc. The zones 10, 12, 16, 24 and 26 can be obtained simultaneously by the diffusion of boron and be $P^+$conductive, have a thickness of approximately 1$\mu$ and a surface concentration of approximately $10^{20}$ boron atoms per cc. The further dimensions of the zones can be chosen in normal manner in accordance with the desired properties. The PN-junctions 14, 15, 27 and 28 show breakdown voltages of approximately 8 volts and the insulating layer below the gate electrodes 6 and 7 shows a breakdown voltage of approximately 100 volts.

The insulating layer 5 may consist, for example, of silicon oxide and/or silicon nitride and the metal layer, the gate electrodes and the conductive track may consist of aluminum.

In the example described the diode zones 10, 12, 24 and 26 and the connection zone 16 are thinner than the diode zones 11 and 25, the electrode zones 3 and 4, and the island zone 8. The zones 10, 12, 14, 26 and 16, however, may also be thicker than the zones 11, 25, 3, 4 and 8. The zones 11 and 25 can be situated entirely in the zones 12 and 26.

Figure 3:
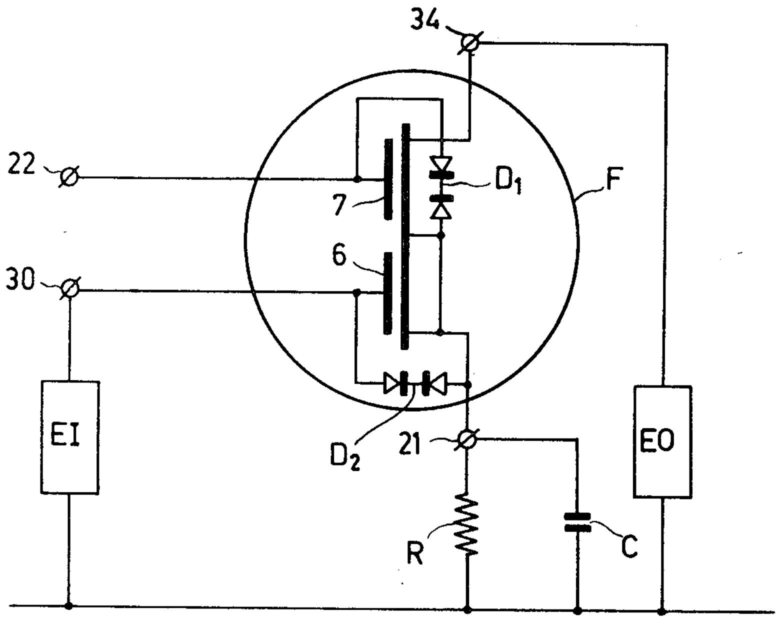
FIG. 3 is a circuit arrangement comprising a field effect transistor according to the invention.

FIG. 3 shows a circuit arrangement comprising a field-effect transistor F of the type as shown in FIGS. 1 and 2. The connection terminals correspond to the metal layers 21, 22, 30 and 34 in the preceding Figures and have the same reference numerals as said metal layers. The diode $D_1$ connected to the gate electrode 7 corresponds to the diode 10, 11, 12 and the diode $D_2$ connected to the gate electrode 6 corresponds to the diode 24, 25, 26 shown in the preceding figures.

An input circuit E1 is connected via the terminals 30 and 21 between the gate electrode 6 which is not connected to the safety diode $D_1$ present in the aperture 9 of the island zone 8 and the electrode zone 3 which is situated nearest to said gate electrode 6. An output circuit EO is connected via the terminals 21 and 34 between the two electrode zones 3 and 4. A voltage to adjust the transistor F is applied to the gate electrode 7 which is connected to the diode $D_1$ situated in the aperture 9 of the island zone 8. Said adjusting voltage may be variable.

The diodes $D_1$ and $D_2$ hence are connected between the gage electrodes 7 and 6 and the input terminal 21, respectively, and pulsatory charge and breakdown currents can readily flow via current paths of low resistance between the diodes $D_1$ and $D_2$ and the gate electrodes 7 and 6, respectively, and between the diodes $D_1$ and $D_2$ and at the input terminal 21 connected to ground.

The circuit arrangement shown is to be preferred over a circuit arrangement in which an input circuit is connected to the terminal 34 (and thus to the electrode zone 4) since the said currents through the diodes $d_1$ and $D_2$ are supplied or removed preferably via an input terminal, that is, the terminal 21 connected to the electrode zone 3.

For reasons of circuit technology the input terminal 21 is usually connected to ground via a resistor R and a decoupling capacitor C.

It will be obvious that the invention is not restricted to the example described and that many variations are possible to those skilled in the art without departing from the scope of the present invention. The connection zone 16 reduces the resistance to currents which flow between the diode 10, 11, 12 and the electrode zone 3 and improves the current-voltage characteristic of the diode. However, this is not necessary for all applications so that the zone 16 can be omitted for a number of applications. The transistor may comprise more than two gate electrodes and more than one island zone, in which in more than one island zone an aperture may be provided in which a safety diode is provided which is connected to a gate electrode. It is also possible that an island zone comprises, for example, 2 apertures having a safety diode situated therein, the safety diodes being connected to various gate electrodes. The safety diode (24, 25, 26) can be provided in an aperture of the electrode zone 3 instead of beside said zone. Furthermore, another circuit element, for example, a resistor, may be provided in an aperture of an island zone. Conventional materials other than those mentioned may be used in which the semiconductor body may consist, for example, of a III–V compound.

What is claimed is:

1. A field-effect transistor comprising a semiconductor substrate of one type conductivity type and having a major surface, spaced source and drain regions of the opposite type conductivity and within the substrate and adjoining the said surface, an island zone of the opposite conductivity type within the substrate and adjoining the said surface and located in the space between the source and drain regions but spaced from the latter regions, a portion of said island zone being interrupted to form an aperture therein through which aperture the said substrate has a portion extending to the said surface, an insulating layer on the said surface, at least first and second gate electrodes on the insulating layer, the first gate electrode extending over the space between the island zone and the drain region, the second gate electrode extending over the space between the island zone and the source region, a semiconductor device containing a rectifying junction built into the said substrate portion extending to the surface through the island zone aperture, connections to the source and drain regions, and means connecting the semiconductor device to a gate electrode.

2. A field-effect transistor as claimed in claim 1 wherein one of the source and drain regions is surrounded by one of the first and second gate electrodes, said one gate electrode is surrounded by the other of the gate electrodes, and said other gate electrode is surrounded by the other of the source and drain regions.

3. A field-effect transistor as claimed in claim 1 wherein the semiconductor device is a safety diode which is connected to said first gate electrode.

4. A field-effect transistor as claimed in claim 3 wherein the safety diode comprises a first surface diode zone of the opposite type conductivity and a second surface diode zone of the one type conductivity adjoining said first surface diode zone but having a higher doping than that of the substrate.

5. A field-effect transistor as claimed in claim 4 wherein the second diode zone fully encircles the first diode zone and is connected to the first gate electrode.

6. A field-effect transistor as claimed in claim 4 wherein the safety diode comprises a third surface diode zone of the one type conductivity which is fully surrounded by the first diode zone in the semiconductor substrate, the third diode zone being connected to the first gate electrode.

7. A field-effect transistor as claimed in claim 4 wherein a connection zone connects the second diode zone to one of the source and drain regions, said connection zone comprising a surface zone of the substrate of the one type conductivity which is more highly doped than the island zone, which adjoins the second diode zone, which crosses a part of the island zone adjoining the aperture, which crosses the gate electrode which is not connected to the diode, and which adjoins the said one region forming a PN-junction, and further comprising a metal layer on the semiconductor substrate and short-circuiting the said PN-junction.

8. A field-effect transistor as claimed in claim 1 wherein the gate electrode which is connected to the semiconductor device comprises a widened contact pad which is situated for the greater part on the insulating layer and above the island zone aperture and which is connected to the device element via an aperture in the insulating layer.

9. A circuit arrangement comprising a field-effect transistor as claimed in claim 16, an input circuit connected between the gate electrode which is not connected to the said safety diode and the source or drain region situated nearest to said gate electrode, an output circuit connected between the source and drain regions, and means for applying a voltage to the gate electrode which is connected to the said safety diode.